United States Patent
Sakaguchi et al.

(10) Patent No.: US 10,915,126 B2
(45) Date of Patent: Feb. 9, 2021

(54) VOLTAGE REGULATOR AND METHOD OF TESTING THE SAME

(71) Applicant: ABLIC Inc., Chiba (JP)

(72) Inventors: Kaoru Sakaguchi, Chiba (JP);
Yasuhiko Ogura, Chiba (JP);
Munetaka Yoshimura, Chiba (JP);
Hiroki Takahashi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/552,733

(22) Filed: Aug. 27, 2019

(65) Prior Publication Data

US 2020/0073424 A1    Mar. 5, 2020

(30) Foreign Application Priority Data

Sep. 4, 2018   (JP) ................................ 2018-165406

(51) Int. Cl.
*G05F 1/575*    (2006.01)
*G01R 31/40*    (2020.01)

(52) U.S. Cl.
CPC .............. *G05F 1/575* (2013.01); *G01R 31/40* (2013.01)

(58) Field of Classification Search
None
See application file for complete search history.

(56) References Cited

U.S. PATENT DOCUMENTS

2014/0266105 A1*   9/2014   Li ........................... G05F 1/565
                                                                        323/280
2017/0279358 A1*   9/2017   Kobayashi .............. H02M 1/08

FOREIGN PATENT DOCUMENTS

JP            2017-174116 A      9/2017

* cited by examiner

*Primary Examiner* — Jeffrey A Gblende
(74) *Attorney, Agent, or Firm* — Brinks Gilson & Lione

(57) ABSTRACT

A voltage regulator includes an output voltage terminal which supplies an output voltage having a preset value, a voltage adjustment terminal which detects the output voltage, an error amplifier which compares the output voltage and a reference voltage to control the output voltage, a phase compensation capacitor, a test circuit which switches a normal mode with a test mode to test the phase compensation capacitor, a switch which makes the phase compensation capacitor valid or invalid, and a constant current source which makes a bias current of the error amplifier in the test mode lower than that in the normal mode.

1 Claim, 4 Drawing Sheets

VOLTAGE REGULATOR AND METHOD OF TESTING THE SAME

RELATED APPLICATIONS

Priority is claimed on Japanese Patent Application No. 2018-165406, filed on Sep. 4, 2018, the content of which is incorporated herein by reference.

BACKGROUND OF THE INVENTION

1. Field of the Invention

The present invention relates to a voltage regulator and a method of testing the voltage regulator.

2. Description of the Related Art

Generally, a voltage regulator generates a constant output voltage VOUT at an output terminal in response to an input voltage (power supply voltage) VIN. At this time, the voltage regulator performs the operation in which the output voltage VOUT is always kept constant by supplying a current according to a variation of a load.

Normally, the voltage regulator has a phase compensation circuit which adjusts the frequency of the zero appearing in the transfer function to thereby improve responsiveness, and provides a stable operation thereof without causing a malfunction such as oscillations even with a small output capacitance.

Since the effect of the above-described stable operation cannot be obtained unless the phase compensation circuit is formed correctly as designed, it is necessary to test the phase compensation circuit in its manufacturing process.

However, it is difficult to directly show the completeness of a capacitor or the like for the phase compensation circuit disposed inside of the circuit, i.e., absence of a failure in individual elements such as abnormality of an oxide film, connection failure of a contact or the like in a test carried out in the manufacturing process for the voltage regulator.

In a formation of a testing pad terminal for testing each element of the phase compensation circuit, for example, the chip area increases by the testing pad terminal, and the capacitance of the phase compensation capacitor (condenser) in the phase compensation circuit changes due to a parasitic capacitance component by the testing pad terminal, so that the performance of the phase compensation circuit is impaired.

There is therefore a test method of performing an indirect determination as to a connection failure of the phase compensation capacitor in the phase compensation circuit, and whether the capacitance of the phase compensation capacitor is in the range of the design specification, etc. In the test method, the discharge time of an electric charge accumulated in the phase compensation capacitor or a discharge current is measured to thereby determine a connection failure of the phase compensation capacitor and its capacitance (refer to, for example, Japanese Patent Application Laid-Open No. 2017-174116).

FIG. 5 illustrates a circuit diagram of the voltage regulator in Japanese Patent Application Laid-Open No. 2017-174116. The phase compensation circuit 110 includes a phase compensation capacitor 111 and a resistor 112.

Further, the voltage regulator is provided with a test circuit 120 which performs a test of the phase compensation capacitor 111 in the phase compensation circuit 110. The test circuit 120 includes a p-channel type MOS transistor 121 and an n-channel type MOS transistor 122, and a constant current source 123.

The voltage regulator has an output voltage terminal $T_{VOUT}$ and a voltage adjustment terminal $T_{VADJ}$.

In testing the phase compensation capacitor 111, as the first stage, the p-channel type MOS transistor 121 is turned on, and the n-channel type MOS transistor 122 remains turned off to sufficiently accumulate electric charge in the phase compensation capacitor 111.

Then, as the second stage, the p-channel type MOS transistor 121 and the n-channel type MOS transistor 122 are turned off to measure a current consumption ICS1 of the voltage regulator.

As the third stage, the p-channel type MOS transistor 121 remains turned off, and the n-channel type MOS transistor 122 is turned on to discharge the electric charge accumulated in the phase compensation capacitor 111 through the constant current source 123.

At this time, the discharge current to discharge the electric charge of the phase compensation capacitor 111 is added to the current consumption ICS1 described above, so that the current consumption ICS2 of the voltage regulator becomes a current larger than the current consumption ICS1. Then, the current consumption ICS2 is measured after starting the discharge of the phase compensation capacitor 111, and time T until the current consumption ICS2 becomes equal to the current consumption ICS1 is measured, whereby it is possible to determine absence of the connection failure of the phase compensation capacitor 111 and estimate its capacitance.

In the test method according to Japanese Patent Application Laid-Open No. 2017-174116, however, in the case where the capacitance of the phase compensation capacitor 111 is minute, the electric charge accumulated in the phase compensation capacitor 111 is also small, and the value of the discharge current which flows during discharge of the electric charge also becomes small.

Further, the discharge current of the phase compensation capacitor 111 becomes relatively minute when a current consumption in other part of the circuit of the voltage regulator is very large even though the capacitance of the phase compensation capacitor 111 is not minute.

When the discharge current described above is smaller than the current consumption ICS1, there is a possibility that the discharge current will be included in an error range for measurement of the current consumption of the voltage regulator.

SUMMARY OF THE INVENTION

The present invention has been made to provide a voltage regulator capable of estimating a connection failure and a capacitance even with respect to a phase compensation capacitor having a capacitance which provides a discharge current smaller than a current consumption of the voltage regulator in a steady state, and to provide a method of testing the voltage regulator.

According to one aspect of the present invention, there is provided a voltage regulator including an output voltage terminal which supplies an output voltage having a preset value, a voltage adjustment terminal to detect the output voltage, an error amplifier which compares the output voltage and a reference voltage with each other to control the output voltage, a phase compensation capacitor, a test circuit which switches between a normal mode to output the output voltage and a test mode to test the phase compensation capacitor, a switch which makes the phase compensation capacitor effective or ineffective, and a constant current source which makes a bias current of the error amplifier in the test mode lower than in the normal mode.

According to another aspect of the present invention, there is provided a method of testing a voltage regulator having an output voltage terminal to supply a preset Output voltage, a voltage adjustment terminal to detect the Output voltage, an error amplifier to compare the output voltage and a reference voltage with each other to control the output voltage, and a phase compensation capacitor, the method includes in a test mode to test the phase compensation capacitor, making the phase compensation capacitor effective, supplying a test signal to the voltage adjustment terminal, and measuring a first voltage waveform of the output voltage supplied in response to a variation in the test signal; making the phase compensation capacitor ineffective, supplying the test signal to the voltage adjustment terminal, and measuring a second voltage waveform of the output voltage supplied in response to the variation in the test signal; and comparing the phase of the first voltage waveform and the phase of the second voltage waveform to test the phase compensation capacitor.

According to the present invention, it is possible to provide a voltage regulator capable of estimating a connection failure and a capacitance even with respect to a phase compensation capacitor having a capacitance which provides a discharge current smaller than a current consumption of the voltage regulator in a steady state, and to provide a method of testing the voltage regulator.

DETAILED DESCRIPTION OF THE PREFERRED EMBODIMENTS

An embodiment of the present invention will hereinafter be described with reference to the accompanying drawings.

Figure 1:
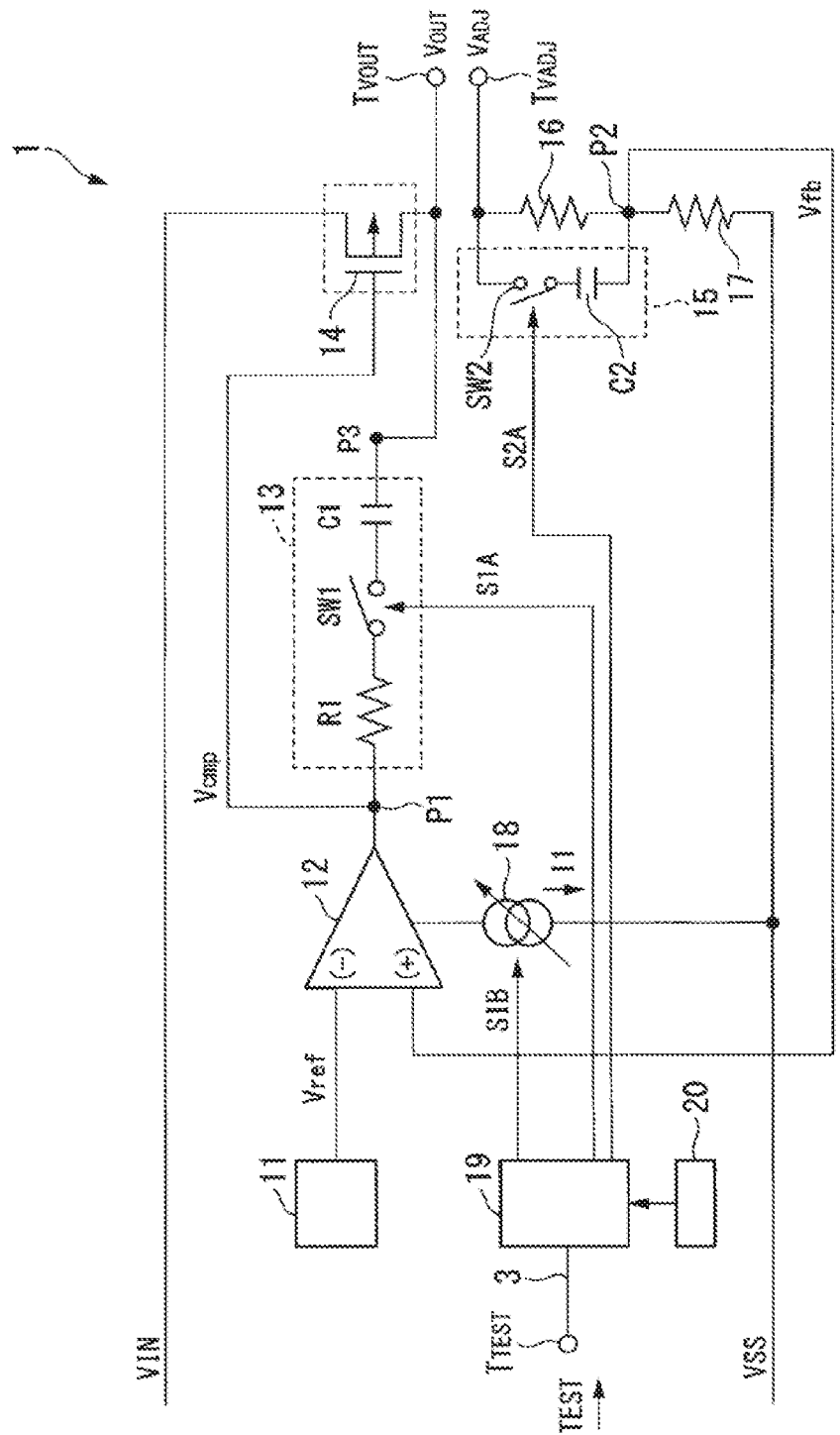
FIG. 1 is a circuit diagram illustrating a configuration example of a voltage regulator according to an embodiment of the present invention.

FIG. 1 is a circuit diagram illustrating a configuration example of a voltage regulator according to an embodiment of the present invention.

The voltage regulator 1 includes a reference power source 11, an error amplifier 12, a phase compensation circuit 13, an output transistor 14, a feedback phase compensation circuit 15, resistors 16 and 17, a variable constant current source 18, a test circuit 19, and a state restriction circuit 20.

Further, the phase compensation circuit 13 includes a resistor R1, a switch SW1, and a phase compensation capacitor C1. The feedback phase compensation circuit 15 includes a switch SW2 and a phase compensation capacitor C2.

The reference power source 11 generates a reference voltage Vref and supplies the reference voltage Vref to an inversion input terminal (−) of the error amplifier 12.

The error amplifier 12 amplifies a voltage of a difference between a feedback voltage Vfb supplied from a connecting point P2 to a non-inversion input terminal (+) and the reference voltage Vref supplied to the inversion input terminal (−) and supplies an amplified voltage Vcmp from an output terminal.

The resistor R1 has one end connected to the output terminal of the error amplifier 12 and a connecting point P1, and the other end connected to one end of the switch SW1. The other end of the switch SW1 which has two terminals is connected to one end of the phase compensation capacitor C1. The phase compensation capacitor C1 performs phase compensation of delaying the phase of a signal waveform supplied from the output terminal of the error amplifier 12 and has the other end connected to an output voltage terminal TVOUT.

Further, in the present embodiment, the connection of the resistor R1, the switch SW1, and the phase compensation capacitor C1 are constituted in the order thereof from the connecting point P1, they may be however constituted in any order as long as they are connected in series.

The output transistor 14 is a p-channel type MOS transistor and has a source connected to a wiring line for an input voltage (power supply voltage) VIN, a gate connected to the connecting point P1, and a drain connected to the output voltage terminal TVOUT.

The switch SW2 has two terminals and one end connected to a voltage adjustment terminal TVADJ, and the other end connected to one end of the phase compensation capacitor C2. The phase compensation capacitor C2 performs phase compensation to advance the phase of the waveform of the feedback voltage Vfb obtained by dividing an adjustment voltage VADJ supplied from the voltage adjustment terminal TVADJ by the resistors 16 and 17. The other end of the phase compensation capacitor C2 is connected to the connecting point P2.

Further, in the present embodiment, the connection of the switch SW2 and the phase compensation capacitor C2 are constituted in the order thereof from the voltage adjustment terminal TVADJ, they may be however constituted in any order as long as they are connected in series.

The resistor 16 has one end connected to the voltage adjustment terminal TVADJ, and the other end connected to the connecting point P2. The resistor 17 has one end connected to the connecting point P2 and the other end connected to a wiring line for an input voltage (ground voltage) VSS.

Here, each of the resistors 16 and 17 constitutes a voltage division circuit which divides the adjustment voltage VADJ provided from the voltage adjustment terminal TVADJ by a resistance ratio and supplies the divided voltage from the connecting point P2 as the feedback voltage Vfb.

The variable constant current source 18 adjusts a bias current I1 used to drive the error amplifier 12, and is interposed between the negative side power supply terminal of the error amplifier 12 and the wiring line for the input voltage VSS.

The variable constant current source 18 may also have a constitution interposed between the wiring line for the input voltage VIN and the positive side power supply terminal of the error amplifier 12.

In a test mode to test the phase compensation capacitors C1 and C2, the test circuit 19 performs on/off control of the switches SW1 and SW2 and control of the bias current I1 of the variable constant current source 18.

Here, the test circuit 19 is supplied with, for example, each of test signals SG1, SG2, and SG3 as a test signal. The test circuit 19 enters a normal mode by the test signal SG1 of L level, whereas enters a test mode by the test signal SG1 of H level.

For the test signal SG1 of L level, the test circuit 19 supplies a control signal SIB (e.g., of L level) to instruct the variable constant current source 18 to supply a bias current I1 in the normal mode, to the variable constant current source 18.

On the other hand, for the test signal SG1 of H level, the test circuit 19 supplies a control signal SIB (e.g., of H level) to instruct the variable constant current source 18 to supply a bias current I1 smaller than that in the normal mode, to the variable constant current source 18.

Also, in response to the test signal SG1 of L level, the test circuit 19 supplies control signals S1A and S2A (e.g., of H level) to turn on the switches SW1 and SW2, respectively.

Further, input of each of the test signals SG2 and SG3 becomes valid in the test mode at the test signal SG1 of H level.

In response to the test signal SG2 of L level, the test circuit 19 supplies a control signal S1A (e.g., of L level) to instruct the turning-off of the switch SW1 to the switch SW1 to turn off the switch SW1.

On the other hand. In response to the test signal SG2 of H level, the test circuit 19 supplies a control signal S1A (e.g., of H level) to instruct the turning on of the switch SW1 to the switch SW1 to turn on the switch SW1.

Likewise, in response to the test signal SG3 of L level, the test circuit 19 supplies a control signal S2A (e.g., of L level) to instruct the turning-off of the switch SW2 to the switch SW2 to turn off the switch SW2.

On the other hand, in response to the test signal SG3 of H level, the test circuit 19 supplies a control signal S2A (e.g., of H level) to instruct the turning on of the switch SW2 to the switch SW2 to turn on the switch SW2.

A description will hereinafter be made as to the normal mode in the voltage regulator 1.

In the case of the normal mode, the output voltage terminal TVOUT and the voltage adjustment terminal TVADJ are connected, and the switches SW1 and SW2 are respectively turned on. The voltage regulator 1 performs an operation to supply a preset output voltage from the output voltage terminal TVOUT. The output voltage VOUT is thereby divided by the resistance ratio of the resistors 16 and 17, and the divided voltage is supplied from the connecting point P1 to the non-inversion input terminal (+) of the error amplifier 12 as the feedback voltage Vfb.

Then, the error amplifier 12 compares the feedback voltage Vfb and the reference voltage Vref and supplies the amplified voltage Vcmp corresponding to the difference between the feedback voltage Vfb and the reference voltage Vref.

Since the switch SW1 is kept on for the phase compensation at this time, the output voltage VOUT provided to the output voltage terminal TVOUT is supplied to the phase compensation capacitor C1.

Then, the waveform of the output voltage VOUT is differentiated by the phase compensation capacitor C1, and a differentiated waveform signal generated by this differentiation is supplied to the connecting point P1 through the switch SW1 and the resistor R1.

The phase of the differentiated waveform signal is reverse to the voltage waveform of the amplified voltage limp, thereby resulting in hindering a voltage change by the amplified voltage Vcmp at the connecting point P1, whereby the phase of the amplified voltage Vcmp supplied to the gate of the output transistor 14 is delayed.

Further, the output voltage VOUT is supplied from the output voltage terminal TVOUT to the voltage adjustment terminal TVADJ and the switch SW2 is on for the phase compensation.

Then, the waveform of the output voltage VOUT is differentiated by the phase compensation capacitor C2, and a differentiated waveform signal generated by this differentiation is supplied to the connecting point P2 through the switch SW2.

At the connecting point P2, the feedback voltage Vfb is generated by the resistance ratio of the resistors 16 and 17. Since the phase of the differentiated waveform signal is in phase with the voltage waveform of the feedback voltage Vfb, a voltage change by the feedback voltage Vfb at the connecting point P2 is made earlier, thereby advancing the phase of the feedback voltage Vfb supplied to the non-inversion input terminal (+) of the error amplifier 12.

A description will next be made as to the test mode of each phase compensation capacitor in the voltage regulator 1. At this time, the output voltage terminal TVOUT and the voltage adjustment terminal TVADJ are not connected to each other. The teat of the phase compensation capacitor is a quality determination test performed in the manufacturing process of the voltage regulator 1.

Since the tests for the phase compensation capacitors C1 and C2 need to make determinations as to the presence or absence of individual connections of the respective phase compensation capacitors C1 and C2, and their capacitances, they are independently performed.

The following description of the test modes is made in the order of testing the phase compensation capacitor C2 after testing the phase compensation capacitor C1 for convenience, but either of them may first be tested.

In the testing of the phase compensation capacitor C1, the test signal SG1 is fixed to H level, and the test signal SG3 is fixed to L level. That is, by fixing the test signal SG3 to L level in the test of the phase compensation capacitor C1, the test circuit 19 brings the switch SW2 to an off state with the control signal S2A of L level to make the phase compensation capacitor C2 invalid in the operation of the phase compensation.

Further, fixing the test signal SG2 to L level, the test circuit 19 brings the switch SW1 to an off state with the control signal S1A of L level to make the phase compensation capacitor C1 invalid in the operation of the phase compensation.

In this condition, a test pulse is supplied to the voltage adjustment terminal TVADJ. The test pulse is divided by the resistors 16 and 17 to become the feedback voltage Vfb whose voltage level changes across the reference voltage Vref.

Then, the phase of the test pulse and the phase of the output voltage VOUT which changes corresponding to the test pulse are measured to obtain a phase difference Pdiff1A between the phase of the test pulse and the phase of the output voltage VOUT.

Next, fixing the test signal SG2 to the H level, the test circuit 19 brings the switch SW1 to an on state with the control signal S1A of H level to make the phase compensation capacitor C1 valid in the operation of the phase compensation.

In this condition, a test pulse similar to that used in the above-described case where the phase compensation capacitor C1 is made invalid in the operation of the phase compensation is supplied to the voltage adjustment terminal TVADJ.

Then, the phase of the test pulse and the phase of the output voltage VOUT which changes corresponding to the test pulse are measured to obtain a phase difference Pdiff2A between the phase of the test pulse and the phase of the output voltage VOUT.

It is possible to estimate the presence or absence of the connection of the phase compensation capacitor C1 and the capacitance thereof in the manufacturing process from the difference in phases obtained from the above-described cases where the phase compensation capacitor C1 is made valid of invalid for the phase compensation, i.e., from the magnitude of the difference between the phase differences Pdiff2A and Pdiff1A.

Further, the variable constant current source 18 reduces the bias current in the teat mode as compared with the normal mode. The inclination of a voltage change in the amplified voltage Vcmp therefore becomes gentle as compared with the normal mode with the reduction in the current provided from the error amplifier 12. As compared with the case of the bias current I1 in the normal mode, the magnitude (absolute value) of the difference between the phase differences Pdiff2A and Pdiff1A can be enlarged, and the presence or absence of the connection of the phase compensation capacitor C1 or its capacitance can easily be estimated with high accuracy in the manufacturing process thereof Next, in the testing of the phase compensation capacitor C2, a test signal SG1 is fixed to H level, and a test signal SG2 is fixed to L level. That is, by fixing the test signal SG2 to L level in the testing of the phase compensation capacitor C2, the test circuit 19 brings the switch SW1 to an off state with the control signal S1A of L level to make the phase compensation capacitor C1 invalid in the operation of the phase compensation.

Further, fixing the test signal SG3 to L level, the test circuit 19 brings the switch SW2 to an off state with the control signal S2A of L level to make the phase compensation capacitor C2 invalid in the operation of the phase compensation.

In this condition, a test pulse similar to that used in the case of the test of the phase compensation capacitor C1 is supplied to the voltage adjustment terminal TVADJ.

Then, the phase of the test pulse and the phase of the output voltage VOUT which changes corresponding to the test pulse are measured to obtain a phase difference Pdiff1B between the phase of the test pulse and the phase of the output voltage VOUT.

Next, fixing the test signal SG3 to H level, the test circuit 19 brings the switch SW2 to an on state with the control signal S2A of H level to make the phase compensation capacitor C2 valid in the operation of the phase compensation.

In this condition, a test pulse similar to that used in the case where the above-described phase compensation capacitor C2 is made invalid in the operation of the phase compensation is supplied to the voltage adjustment terminal TVADJ.

Then, the phase of the test pulse and the phase of the output voltage VOUT which changes corresponding to the test pulse are measured to obtain a phase difference Pdiff2B between the phase of the test pulse and the phase of the output voltage VOUT.

It is possible to estimate the presence or absence of the connection of the phase compensation capacitor C1 and the capacitance thereof in the manufacturing process from the difference in phases obtained from the above-described cases where the phase compensation capacitor C1 is made valid or invalid for the phase compensation, i.e., from the magnitude of the difference between the phase differences Pdiff2B and Pdiff1B.

Further, the variable constant current source 18 reduces the bias current in the test mode as compared with the normal mode. The inclination of a voltage change in the amplified voltage Vcmp therefore becomes gentle as compared with the normal mode with the reduction in the current provided from the error amplifier 12. As compared with the case of the bias current I1 in the normal mode, the magnitude (absolute value) of the difference between the phase differences Pdiff2B and Pdiff1B can be enlarged, and the presence or absence of the connection of the phase compensation capacitor C2 or its capacitance can easily be estimated with high accuracy in the manufacturing process thereof.

Further, in the above-described embodiment, the variable constant current source 18 is provided in order to easily estimate the presence or absence of the connections of the phase compensation capacitors C1 and C2 or their capacitances in the manufacturing process thereof with high accuracy.

However, in the cases where little accuracy is needed for the estimation of the capacitances of the phase compensation capacitors C1 and C2, and where the test for only the presence or absence of the connections in the manufacturing process is performed, etc., a constant current source which causes only the operating current of the error amplifier 12 may be adopted instead of the variable constant current source 18.

Further, in the above-described embodiment, the voltage regulator 1 has been described as the configuration in which the respective phase compensation capacitors C1 and C2 are provided therein. The voltage regulator 1, however, may have another configuration in which only one the phase compensation capacitor C1 and C2 is provided.

In this configuration, the test signals in the test circuit 19 are the test signals SG1 an SG2 respectively, and the operation of the test signal SG1 is similar to the description of the embodiment shown above.

Here, in the case where only the phase compensation capacitor C1 is provided, the test circuit 19 supplies the control signal S1A to the switch SW1 at L level according to the supply of the test signal SG1 at H level, to turn off the switch SW1.

On the other hand, according to the supply of the test signal SG2 at H level, the test circuit 19 supplies the control signal S1A to the switch SW1 at H level to turn on the switch SW1.

The determination as to the connection of the phase compensation capacitor C1 and the estimation of its capacitance by the difference between the phase differences Pdiff2A and Pdiff1A are similar to the above-mentioned description.

Also, in the case where only the phase compensation capacitor C2 is provided, the test circuit 19 supplies the test signal SG2 to the switch SW2 at level according to the supply of the test signal SG1 at H level, to turn off the switch SW2.

On the other hand, according to the supply of the test signal SG2 at H level, the test circuit 19 supplies the control signal S2A to the switch SW2 at H level to turn on the switch SW2.

The determination as to the connection of the phase compensation capacitor C2 and the estimation of the capacitance thereof by the difference between the phase differences Pdiff2B and Pdiff1B are similar to the above-mentioned description.

Further, in the embodiment described above, the state restriction circuit 20 which fixes the operation of the test circuit 19 to the normal mode without shifting to the test mode is provided. The state restriction circuit 20 has a storage element such as a memory or the like inside so that the test circuit 19 is fixed to the normal mode at the time of shipment or the like and is restricted to the normal mode operation whatever test signal (SG1, SG2, and SG3) is supplied.

In a configuration the test terminal TTEST does not stick outside as a terminal of a package at the time of shipment, however, the state restriction circuit 20 may not be provided.

Figure 2:
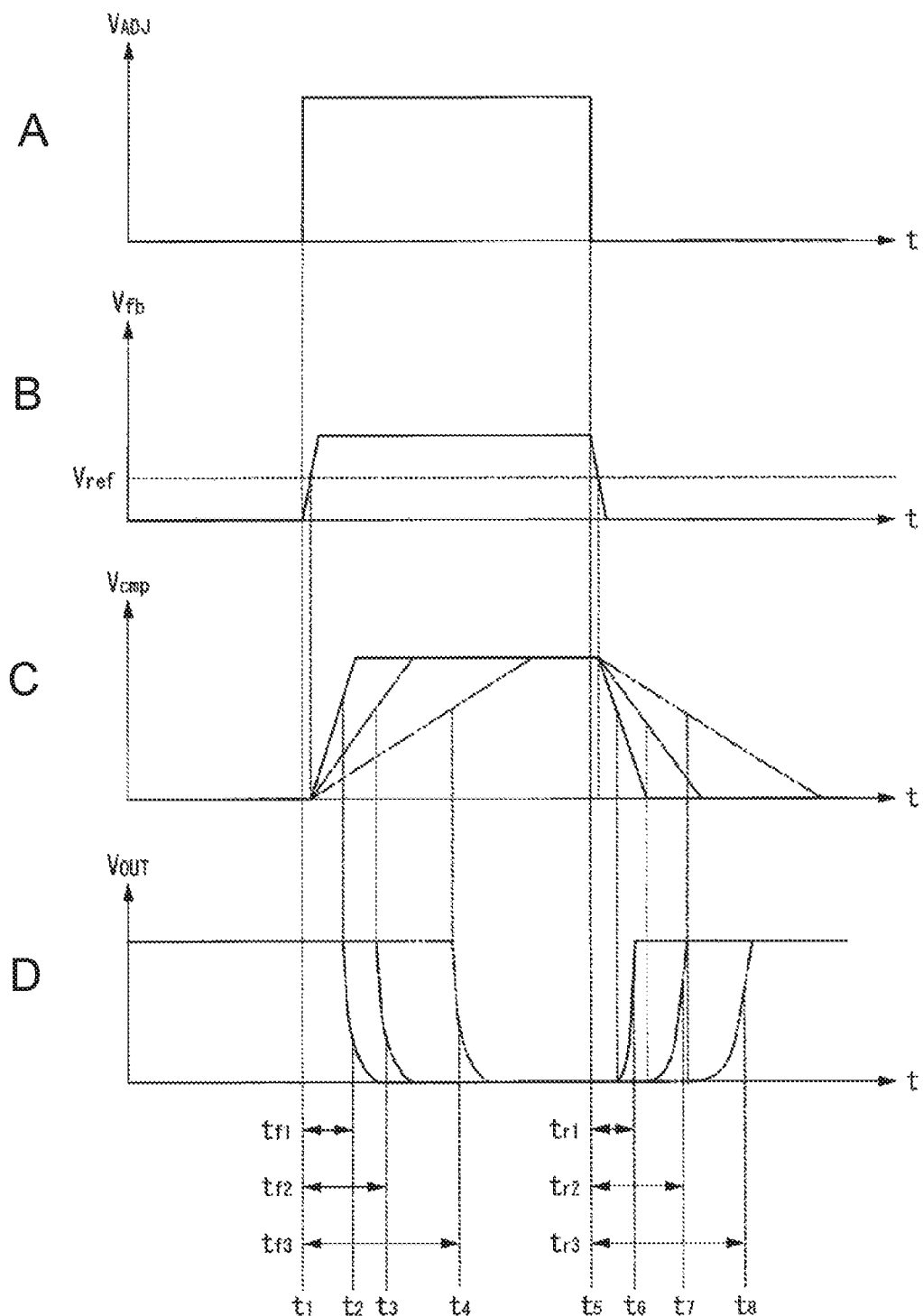
FIG. 2 is a diagram illustrating waveforms indicating the correspondence between a test pulse and a change of the phase of the output voltage VOUT corresponding to the test pulse in a test of a phase compensation capacitor C1.

FIG. 2 is a diagram illustrating waveforms indicating the correspondence between a test pulse and a change of the phase of the output voltage VOUT corresponding to the test pulse in the test for the phase compensation capacitor C1 and includes Graphs A to D.

Here, Graph A illustrates the waveform of the test pulse supplied to the voltage adjustment terminal TVADJ. The vertical axis in Graph A indicates voltage, and the horizontal axis in Graph A indicates time.

Also, Graph B illustrates a change waveform of the feedback voltage Vfb obtained by dividing the voltage of the test pulse by the resistors 16 and 17 which is supplied to the non-inversion input terminal (+) of the error amplifier 12. The vertical axis in Graph B indicates voltage, and the horizontal axis in Graph B indicates time.

Further. Graph C illustrates a waveform of the amplified voltage Vcmp at the connecting point P1 changed by the valid/invalid of the phase compensation capacitors C1 and C2. The vertical axis in Graph C indicates voltage, and the horizontal axis in Graph C indicates time.

Furthermore, Graph D illustrates a waveform of the output voltage VOUT provided from the output voltage terminal TVOUT changed by the valid/invalid of the phase compensation capacitors C1 and C2. The vertical axis in Graph D indicates voltage, and the horizontal axis in Graph D indicates time.

As already described, in the testing of the phase compensation capacitor the test pulse is supplied to the voltage adjustment terminal TVADJ for each state in which the phase compensation capacitor C1 is made valid or invalid for the phase compensation. Then, the phase of the supplied test pulse and the change of the phase of the output voltage VOUT corresponding to the test pulse are compared.

In each of Graphs C and D, the waveform of the amplified voltage Vcmp and the waveform of the output voltage VOUT both of which are indicated by solid lines respectively illustrates a case where the test signal SG1 supplied to the test circuit 19 is at L level, i.e., the normal mode is taken (each of the phase compensation capacitors C1 and C2 is valid for the phase compensation).

Also, in each of Graphs C and D, the waveform of the amplified voltage Vcmp and the waveform of the output voltage VOUT both of which are indicated by one-dot chain lines respectively illustrates a case where the test signal SG1 supplied to the test circuit 19 is at H level, and the test signals SG2 and SG3 are respectively at L level, i.e., the switches SW1 and SW2 are in the off state in the test mode (each of the phase compensation capacitors C1 and C2 are invalid for the phase compensation).

Further, in each of Graphs C and D, the waveform of the amplified voltage Vcmp and the waveform of the output voltage VOUT both of which are indicated by two-dot chain lines respectively illustrates a case where the test signal SG1 supplied to the test circuit 19 is at H level, and the test signal SG2 is at H level, and the test signal SG3 is at L level, i.e., the switch SW1 is in the on state and the switch SW2 is in the off state in the test mode (the phase compensation capacitor C1 is valid for the phase compensation, and the phase compensation capacitor C2 is invalid for the phase compensation).

At time t1: as illustrated in Graph A, the test pulse supplied from an external device to the voltage adjustment terminal TVADJ rises (transition from L level to H level). Here, the feedback voltage Vfb in Graph B changes from a voltage less than the reference voltage Vref to a voltage exceeding the reference voltage Vref. Further, since the bias current is reduced with respect to the rising speed of the amplified voltage Vcmp indicated by the solid line in the normal mode as illustrated in Graph C, the rising speed of the amplified voltage Vcmp indicated by each of the one-dot chain line and the two-dot chain line in the test mode is lowered.

At time t2: as illustrated in Graph D, the voltage waveform of the output voltage VOUT indicated by the solid line changes from H level to L level in response to the rise of the test pulse. The difference Pdiff1 in phases between the test pulse and the voltage waveform of the output voltage VOUT at this time is time tf1.

At time t3: as illustrated in Graph D, the voltage waveform of the output voltage VOUT indicated by the one-dot chain line changes from H level to L level in response to the rise of the test pulse. The difference Pdiff1A in phases between the test pulse and the voltage waveform of the output voltage VOUT at this time is time tf2.

At time t4: as illustrated in Graph D, the voltage waveform of the output voltage VOUT indicated by the two-dot chain line changes from H level to L level in response to the rise of the test pulse. The difference Pdiff2A in phases between the test pulse and the voltage waveform of the output voltage VOUT at this time is time tf3.

The determination as to the connection of the phase compensation capacitor C1 and the estimation of its capacitance are performed on the basis of the difference between the phase difference Pdiff2A and the phase difference Pdiff1A both illustrated in Graph D, i.e., the magnitude of the difference between the time tf3 and the time tf2. Here, the determination as to the connection and the estimation of the capacitance by the difference between the time tf3 and the time tf2 are performed based on an allowable range obtained from executing an actual test and statistically processing the difference between the times tf3 and tf2 in the voltage regulator 1 normally operated in the normal mode.

Further, each of times t5, t6, t7, and t8 is similar to each of the above-described times t1, t2, t3, and t4.

Figure 3:
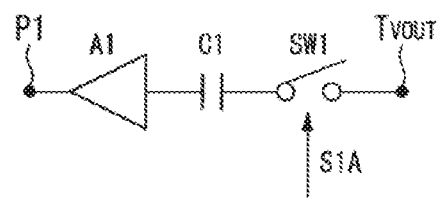
FIG. 3 is a circuit diagram illustrating a modification of a phase compensation circuit 13 in the voltage regulator 1 of FIG. 1.

FIG. 3 is a circuit diagram illustrating a modification of the phase compensation circuit 13 in the voltage regulator 1 of FIG. 1. In FIG. 3, an amplifier A1 having a prescribed gain is provided in exchange of the resistor R1 in the phase compensation circuit 13 of FIG. 1. Each of a phase compensation capacitor C1 and a switch SW1 is similar to that of the phase compensation circuit 13 of FIG. 1 in configuration.

So long as the amplifier A1 is arranged in the succeeding stage of the phase compensation capacitor C1 with respect to the propagating direction of a signal from the output voltage terminal TVOUT to the connecting point P1, the switch SW1 may be arranged at any position of the series connection in configuration.

In the operation of the phase compensation circuit of FIG. 3 in which the switch SW1 is on-state, in which the phase compensation capacitor C1 is valid for the phase compensation, supply of the voltage waveform of the output voltage VOUT provided from the output transistor 14 to the phase compensation capacitor C1 through the switch SW1 causes supply of a differential waveform of the voltage waveform of the output voltage VOUT to the amplifier A1. The amplifier A1 amplifies the differential waveform at a prescribed gain and supplies the same to the connecting point P1. The differential waveform reversed in phase to the change in the amplified voltage Vcmp provided from the error amplifier 12 is thereby supplied to the connecting point P1, so that the phase compensation is performed to suppress the change in the amplified voltage Vcmp.

Figure 4:
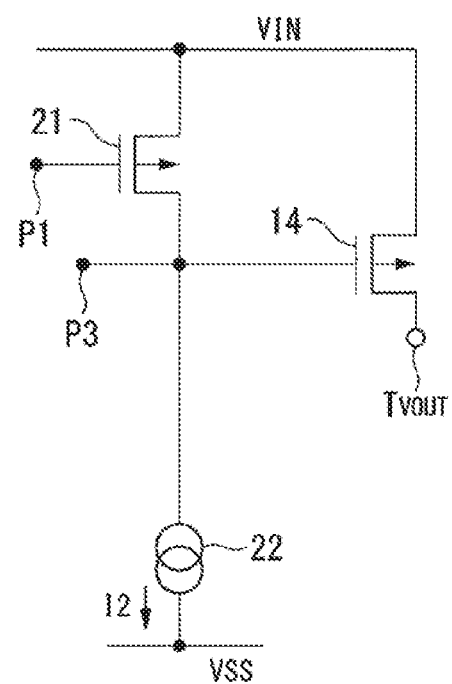
FIG. 4 is a circuit diagram illustrating a modification of an output stage in which an amplifier circuit is added to a stage prior to an output transistor 14.
Figure 5:
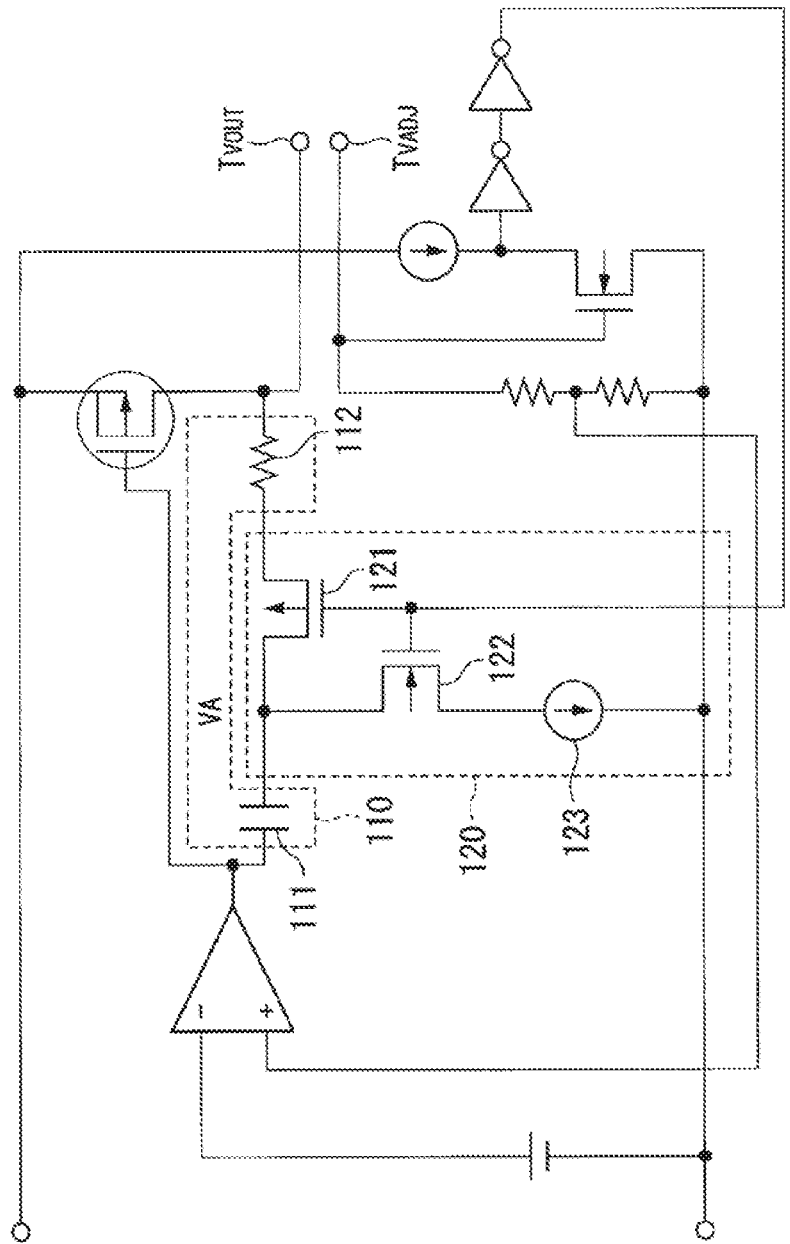
FIG. 5 illustrates a circuit diagram of a voltage regulator of Japanese Patent Application Laid-Open No. 2017-174116.

FIG. 4 is a circuit diagram illustrating a modification of an output stage in which an amplifier circuit is added to a stage prior to the output transistor 14. In FIG. 4, a p-channel type MOS transistor 21 and a constant current source 22 supplying a bias current I2 are provided as the amplifier circuit.

The transistor 21 has a source connected to the wiring line for an input voltage VIN, a gate connected to the connecting point P1, and a drain connected to a connecting point P3 (the gate of the output transistor 14).

The constant current source 22 has one end connected to the drain of the transistor 21, and the other end connected to the wiring line for a power supply VSS.

Each of the transistor 21 and the constant current source 22 constitutes the amplifier circuit which further amplifies the amplified voltage Vcmp provided from the error amplifier 12.

Since the voltage waveforms of the output voltage VOUT and the amplified voltage Vcmp become in-phase where the amplifier circuit of FIG. 4 is used, it is necessary to allow the operation of the error amplifier 12 to correspond to the phase of the output voltage VOUT. To this end, the error amplifier 12 takes a connection of the reference voltage Vref being supplied to the non-inversion input terminal (+) and the feedback voltage Vfb being supplied to the inversion input terminal (−).

Operations in the test mode other than this configuration are similar to those described in FIG. 1.

As described above, according to the present embodiment, measurement of the phase compensation capacitor is carried out by comparing the phase difference between the test pulse and each of the output voltage VOUT in the state in which the phase compensation capacitor is made valid or invalid even to a phase compensation capacitor having a capacitance to provide a discharge current smaller than the current consumption in the steady state of the voltage regulator, it is not necessary to provide a terminal to directly measure the phase compensation capacitor, and it is possible to easily and simply estimate whether the connection of the phase compensation capacitor is poor and whether the capacitance is an abnormal value.

Also, according to the present embodiment, since the bias current of the error amplifier 12 in the test mode is reduced by the variable constant current source 18 as compared with the normal mode to reduce the output current of the error amplifier 12, the voltage change in the amplified voltage Vcmp in the test mode can be made gentle, and the difference in phases between the test pulse and the output voltage VOUT can be enlarged, thereby making it possible to improve the accuracy of comparison of the phase difference therebetween even though the capacitance of the phase compensation capacitor is small.

Further, the present embodiment has been described to have a setting of the combination of the signal levels in which in the testing of the phase compensation capacitor C1, the test signal SG1 is H level and the teat signal SG3 is L level, and in the testing of the phase compensation capacitor C2, the teat signal SG1 is H level and the test signal SG2 is L level. The present embodiment is not however limited to the above-described combination of signal levels. Any setting of the combination of the signal levels may be permitted so long as either of the phase compensation capacitors C1 and C2 can be distinguished as the object to be tested. For example, the combination of the signal levels may be set such that in the testing of the phase compensation capacitor C1 the test signal SG1 is H level and the test signal SG3 is H level, and in the testing of the phase compensation capacitor C2, the test signal SG1 is H level and the test signal SG2 is H level.

Furthermore, the present embodiment has been described that in the testing of the phase compensation capacitor C1 and the phase compensation capacitor C2, the test pulse is supplied to the voltage adjustment terminal TVADJ as the test signal. Since the propagation delay of the test signal is detected, a test of supplying a signal having either rising or falling waveform as the test signal without using the test pulse having both of the rise and fall and detecting the propagation delay of the test signal may, however, be performed. Because the propagation delay can be detected so long as either the rising waveform of the signal level or the falling waveform thereof is provided.

Although the embodiment of the present invention has been described above in detail with reference to the drawings, the specific configurations are not limited to those in the present embodiment and include design in the scope not departing from the spirit of the present invention, etc.

What is claimed is:

1. A method of testing a voltage regulator having an output voltage terminal configured to supply a preset output voltage, a voltage adjustment terminal configured to detect the output voltage, an error amplifier configured to compare the output voltage and a reference voltage to control the output voltage, and a phase compensation capacitor, the method comprising:

in a test mode to test the phase compensation capacitor,
making the phase compensation capacitor operational for phase compensation, supplying a test signal to the voltage adjustment terminal, and measuring a first voltage waveform of the output voltage supplied in response to a variation in the test signal;
making the phase compensation capacitor inoperational for phase compensation, supplying the test signal to the voltage adjustment terminal, and measuring a second voltage waveform of the output voltage supplied in response to the variation in the test signal; and
comparing the phase of the first voltage waveform and the phase of the second voltage waveform to test the phase compensation capacitor.

* * * * *